(12) United States Patent
Lee

(10) Patent No.: US 6,301,112 B1
(45) Date of Patent: Oct. 9, 2001

(54) CLIP MOUNTING A HEAT SINK TO AN ELECTRONIC ELEMENT

(75) Inventor: Hsieh Kun Lee, Chung-Ho (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/506,110

(22) Filed: Feb. 17, 2000

(30) Foreign Application Priority Data

Dec. 23, 1999 (TW) ............................................. 088221951

(51) Int. Cl.[7] ..................................................... H05H 7/20
(52) U.S. Cl. ........................... 361/704; 24/458; 165/80.3; 165/185; 248/505; 174/16.3; 257/727; 361/715; 439/487
(58) Field of Search ..................... 24/295–296, 457–458, 24/625; 165/80.3, 185; 248/505, 510; 257/707, 713, 718–719, 726–727; 361/704, 707, 709, 710, 715; 439/487

(56) References Cited

U.S. PATENT DOCUMENTS

| | | | |
|---|---|---|---|
| 5,436,798 | * 7/1995 | Wieland, Jr. ........................ | 361/710 |
| 5,671,118 | * 9/1997 | Blomquist ............................ | 361/704 |
| 5,889,653 | * 3/1999 | Clemens et al. ..................... | 361/704 |
| 6,111,752 | * 8/2000 | Huang et al. ........................ | 361/704 |

* cited by examiner

Primary Examiner—Gregory Thompson
(74) Attorney, Agent, or Firm—Wei Te Chung

(57) ABSTRACT

A clip for mounting a heat sink to an electronic element includes a pressing body and a pair of latching arms extending from opposite ends of the pressing body. A sloped portion connects the pressing body with each latching arm. Each latching arm defines a latching opening for engaging with a corresponding latching projection of the electronic element. A handling tab is integrally extends outward from one of the latching arms. A slot is defined in the handling tab. Thus, when disassembling the clip from the electronic element, a tooling, such as a screwdriver, is partially inserted into the slot of the clip and then ensures an easy disengagement the latching opening of the clip from the latching projection of the electronic element.

4 Claims, 5 Drawing Sheets

CLIP MOUNTING A HEAT SINK TO AN ELECTRONIC ELEMENT

BACKGROUND OF THE INVENTION

The present invention relates to a clip, and particularly to a spring clip which can be easily assembled/disassembled to/from a heat sink and an associated electronic device.

Referring to FIGS. 4 and 5, a conventional clip 1 used for attaching a heat sink 9 to an electronic element 8 comprises a pressing body 2 for engaging in a positioning groove 90 defined in the heat sink 9, and a pair of latching arms 4 substantially perpendicularly extending from opposite ends of the pressing body 2. A sloped portion 3 connects the pressing body 2 with the latching arm 4. A latching opening 5 is defined in each latching arm 4 for engaging with a corresponding latching projection (not shown) formed on the electronic element. A manipulating tab 7 integrally extends outward from a slot 6 defined in each latching arm 4 for a tooling (not shown) to disassemble the clip 1 from the heat sink and the electronic element.

However, disengagement slippage between the tooling and the handling tabs 7 of the clip 1 is frequently experienced during actual operations since the handling tabs 7 are usually too small to be held firmly. Moreover, if large snapping force is exerted on the handling tabs 7 of the clip 1 by the tooling, the handling tabs 7 are easy to be broken off from the clip 1, thus, it is even more difficult to disengage the clip 1 from the electronic element 8. Moreover, the manipulating tabs 7 can be easily broken off from the clip 1 if it is overloaded.

Therefore, an improved clip is desired.

BRIEF SUMMARY OF THE INVENTION

A main object of the present invention is to provide a clip for attaching a heat sink to an electronic element and which can be readily disassembled from the heat sink and the electronic element.

Another object of the present invention is to provide a clip for attaching a heat sink to an electronic element which fulfills the miniature requirements.

A clip for mounting a heat sink to an electronic element in accordance with the present invention comprises a pressing body and a pair of latching arms extending from opposite ends of the pressing body. A sloped portion connects the pressing body with each latching arm. Each latching arm defines a latching opening for engaging with a corresponding latching projection of the electronic element. A handling tab is integrally extends outward from one of the latching arms in which a slot is defined. Thus, when disassembling the clip from the electronic element is needed, a tooling, such as a screwdriver, may be partially inserted into the slot of the clip and pivoted such that the latching opening of the clip is easily disengaged from the latching projection of the electronic element.

Other objects, advantages and novel features of the invention will become more apparent from the following detailed description when taken in conjunction with the accompanying drawings.

DETAILED DESCRIPTION OF THE INVENTION

Figure 2:
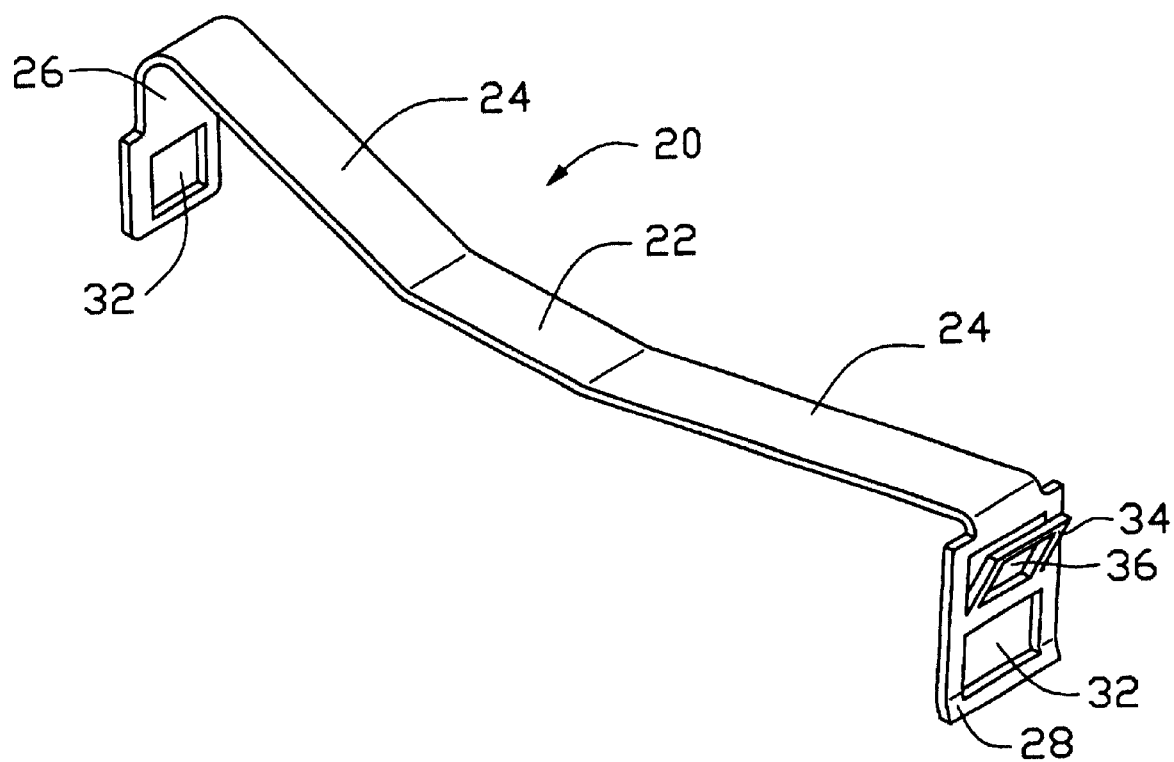
FIG. 2 is a perspective view of the clip of FIG. 1.

Referring to FIG. 2, a clip 20 in accordance with the present invention is suitable for mounting a heat sink 30 to an electronic or electrical element 60, such as an assembly of a central-processing unit (CPU) 40 and a socket 50. The clip 20 comprises a pressing body 22 and a pair of latching arm 26, 28 extending from opposite ends of the pressing body 22. Each latching arms 26, 28 is bent at a suitable angle relative to the pressing body 22. Each latching arm 26, 28 includes a sloped portion 24 to connect to the pressing body. A latching opening 32 is defined in each latching arm 26, 28 for engaging with anchorage/projection 52 of the socket 50. A handling tab 34 integrally extends outward from the latching arm 28 and defines a slot 36 therein for facilitating manual operations thereon.

Figure 1:
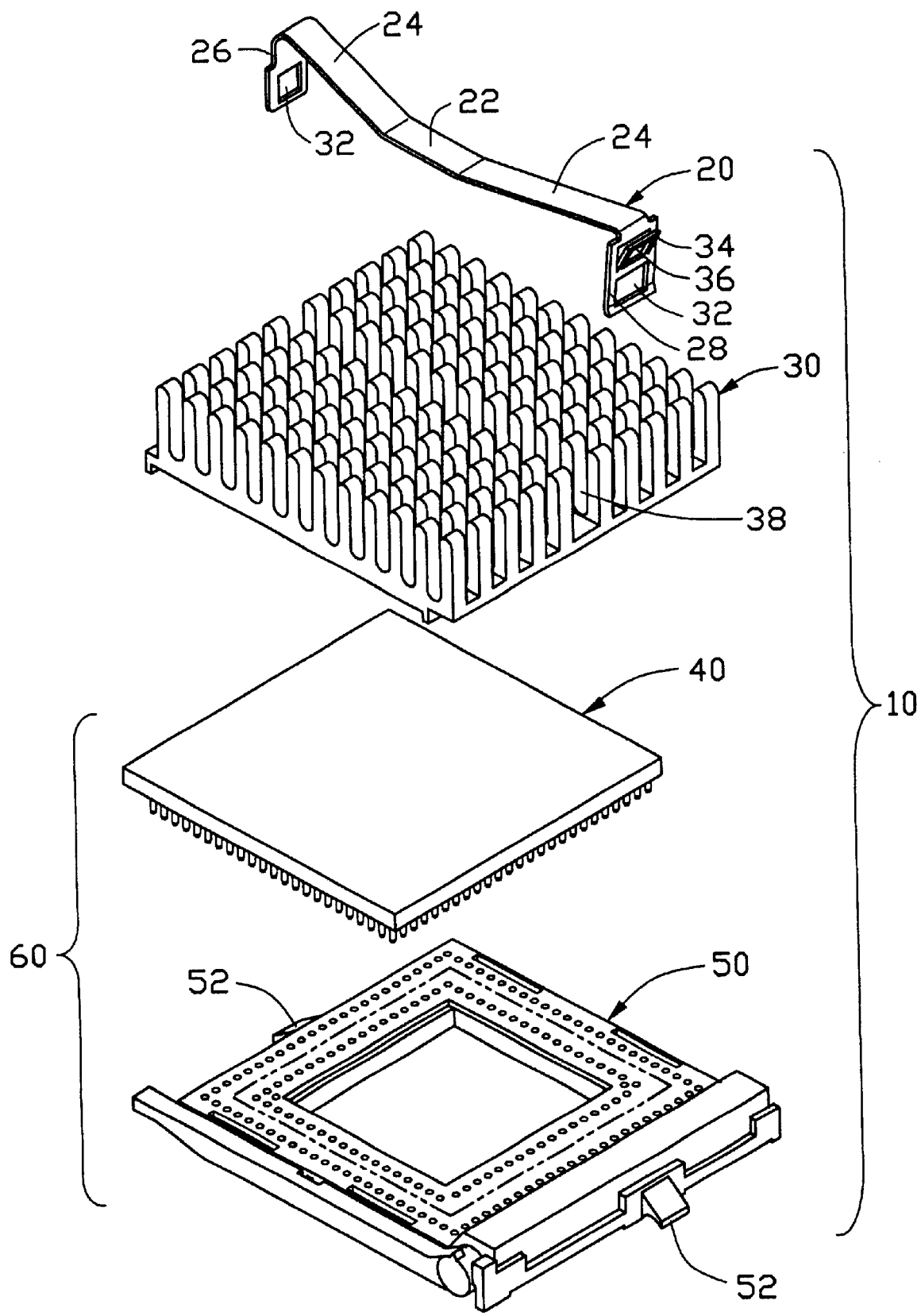
FIG. 1 is an exploded view of a clip, a heat sink and an electronic element in accordance with the present invention.
Figure 3:
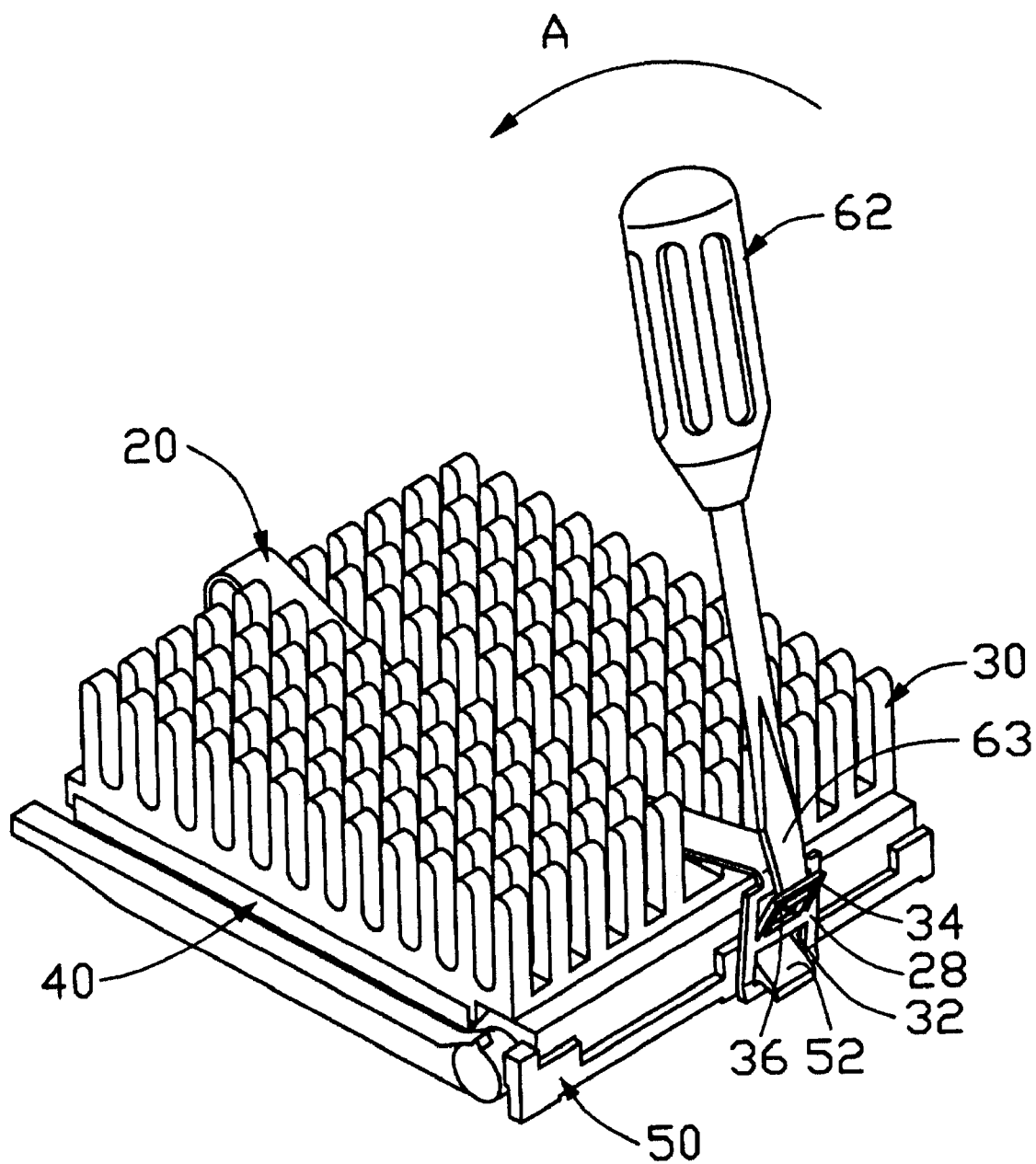
FIG. 3 is a perspective view showing a tooling exerted to the clip for disengage the clip from the electronic element in FIG. 1.
Figure 4:
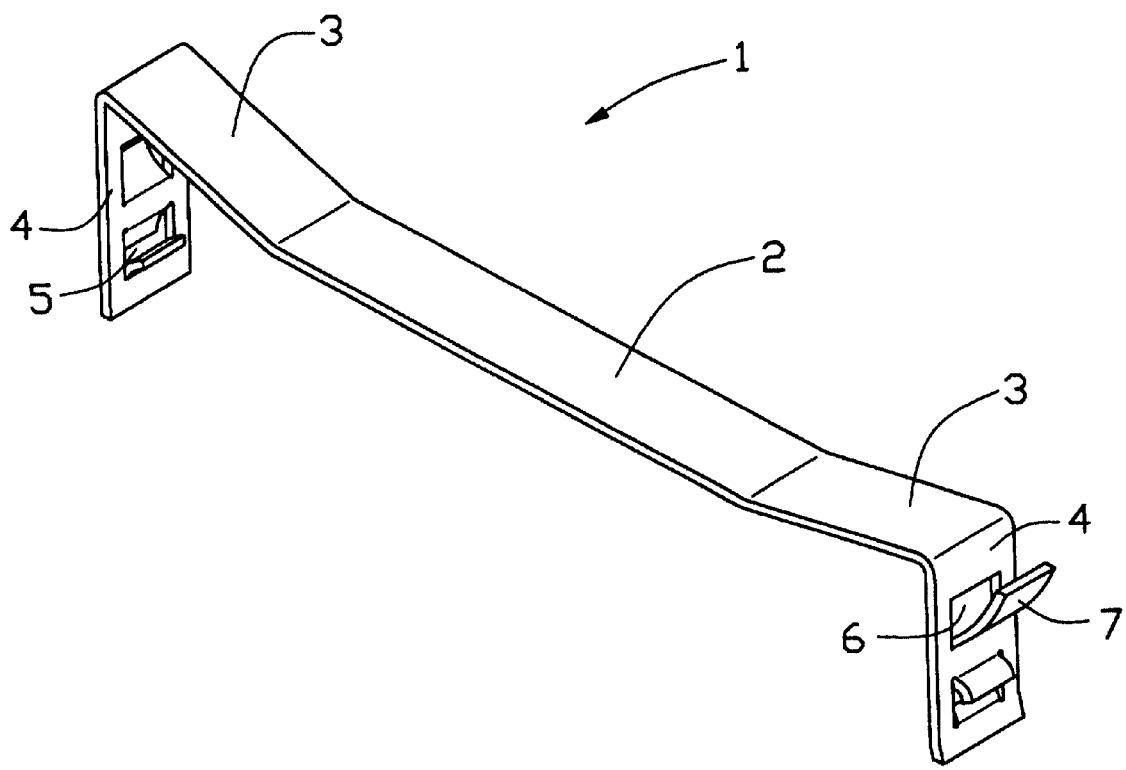
FIG. 4 is a perspective view of a conventional clip.
Figure 5:
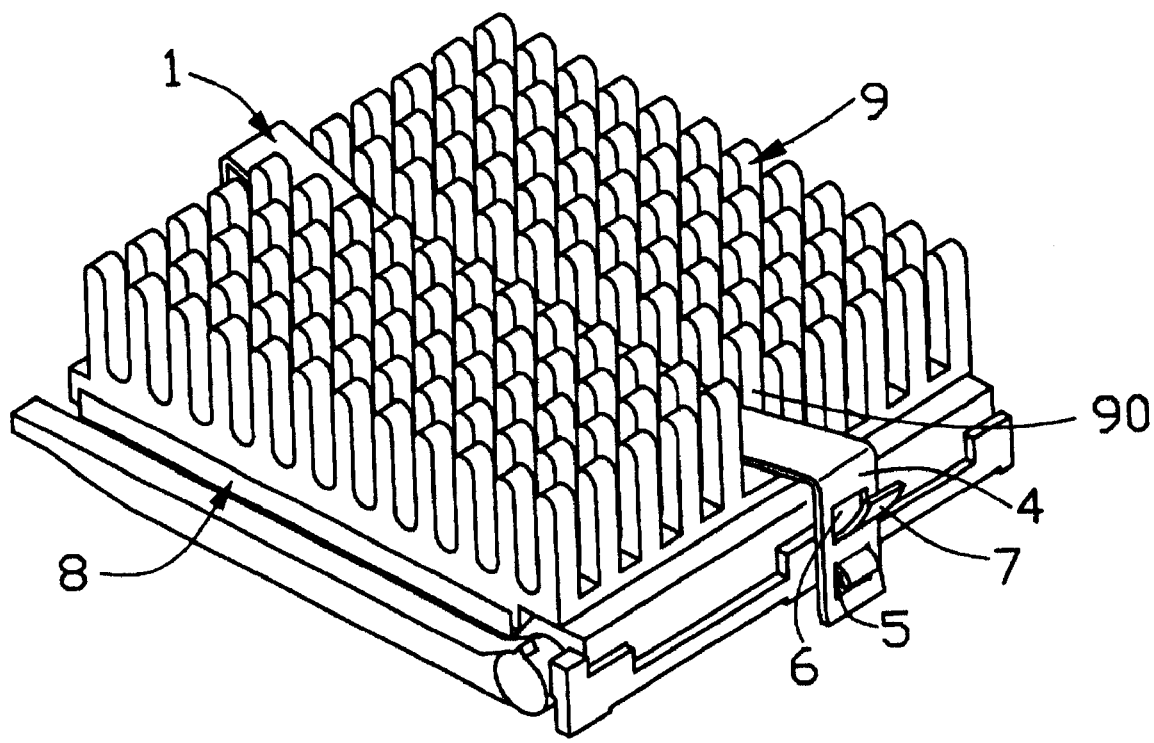
FIG. 5 is an assembled view of the conventional clip in FIG. 4, a heat sink and an electronic element.

Referring further to FIGS. 1 and 3, in assembly, the pressing body 22 of the clip 20 is first positioned with a corresponding groove 38 defined in the heat sink 30. The assembly process of the CPU 40 and the socket 50 is known to a person with ordinary skill of this field and thus is not repeated here. Attaching the CPU 40 to the socket 50 is known to the skill in the art and not detailed description is given below. The heat sink 30 and the clip 20 are then assembled with the assembly 60 so that the latching openings 32 of the clip 20 are engaged with the corresponding latching projections 52 of the socket 50. Therefore, a compact assembly 10 consisting of the clip 20, the heat sink 30, the CPU 40 and the socket 50 is completed.

When disassembling the clip 20 from the socket 50, a screwdriver 62 can be used. A front blade 63 of the screwdriver 62 is fitted into the slot 36 of the clip 20. The screwdriver 62 is then pivoted in a direction as shown by arc A of FIG. 3 to exert a force upon the latching arm 28 of the clip 20 thereby easily disengaging the latching opening 32 of the clip 20 from the corresponding latching projection 52 of the socket 50. In addition, any shaft-like tooling with a suitable blade corresponding to the slot 36 of the clip 20 can be adopted to disassemble the clip 20 from the electronic element 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for mounting a heat sink to an electronic element, comprising:

a pressing body;

a pair of latching arms extending outward from two opposite ends of the pressing body and being bent at appropriate angles relative to the pressing body, each latching arm defining a latching opening the rein for engaging with the electronic element, wherein a handling tab integrally extends upwardly and outwardly approximately from a middle of one of said latching arms and defines a slot in the handling tab, said slot being adapted for fitting with a manipulating tool for the clip.

2. The clip for mounting a heat sink to an electronic element as claimed in claim 1, wherein the pressing body comprises a respective sloped portion connecting with each latching arm.

3. An electrical assembly comprising:

a socket forming a pair of locking projections on two ends;

a CPU positioned atop the socket;

a heat sink positioned atop the CPU and defining a groove extending to both said two ends; and a one-piece clip including a pressing body received within said groove, and a pair of latching arms extending outwardly from two ends of the pressing body, each of said pair of latching arms being bent downwardly and confronting the two ends of the socket with a latching opening on a lower portion thereof, said latching opening latchably engaged with the corresponding locking projection, and a handling tab integrally extending upwardly and outwardly approximately from a middle portion of one of the latching arms, said handling tab further defining a slot therein which is dimensioned to be adapted to receive a front blade of a screw driver for outwardly deflecting said one of the latching arms with regard to the socket and unlatching the clip form the socket.

4. A clip for mounting a heat sink to an electronic element, comprising:

a pressing body;

a pair of latching arms extending outwardly form two opposite ends of the pressing body, each of said pair of latching arms being bent at an appropriate angle relative to the pressing body, and defining a latching opening on a lower portion thereof, a handling tab formed on an upper portion of at least one of the latching arms; wherein the handling tab is directly stamped from and integrally upwardly extends obliquely and outwardly from the at least one of the latching arms, and defines a slot in the handling tab, said slot being dimensioned to comply with a front blade of a screw driver for allowing said front blade to extend therethrough and be efficiently engaged with the at least one of the latching arms.

* * * * *